(12) United States Patent
Su

(10) Patent No.: US 7,138,879 B2
(45) Date of Patent: Nov. 21, 2006

(54) INJECTION-LOCKED FREQUENCY DIVIDER AND FREQUENCY DIVIDING METHOD THEREOF

(75) Inventor: Tung-Ming Su, Kao-Hsiung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 54 days.

(21) Appl. No.: 10/905,054

(22) Filed: Dec. 13, 2004

(65) Prior Publication Data

US 2005/0248410 A1 Nov. 10, 2005

(30) Foreign Application Priority Data

May 6, 2004 (TW) ................. 93112758 A

(51) Int. Cl.
*H03B 1/00* (2006.01)
(52) U.S. Cl. .................. 331/74; 331/185; 331/57; 377/47
(58) Field of Classification Search .......... 331/74, 331/16, 57, 185; 455/216; 377/47
See application file for complete search history.

(56) References Cited

U.S. PATENT DOCUMENTS 4,953,010 A * 8/1990 Cowley ............... 348/726

6,781,471 B1 8/2004 Huang
2003/0025566 A1 2/2003 Rogers

OTHER PUBLICATIONS

Hamid R. et al., Superharmonic Injection-Locked Frequency Dividers, IEEE Journal of Solid-State Circuits, vol. 34, No. 6, Jun. 1999.
Herber Knapp et al., 2-GHz/2-mW and GHz/30-mW Dual-Modulus Prescalers in Silicon Bipolar Technology, IEEE Journal of Solid-State Circuits, vol. 36, No. 9, Sep. 2001.
Rafael J. Betancourt-Zamora, CMOS Injection-locked Ring Oscillator Frequency Dividers, Stanford Microwave integrated Circuits Laboratory, Mar. 29, 2001, pp. 1-40.
Wu, et al., A 19GHz 1.5mW 0.35um CMOS Frequency Divider with Shunt-Peaking Locking-Range Enhancement, IEEE Solid-State Circuits, Conference 2001.

* cited by examiner

*Primary Examiner*—Arnold Kinkead
(74) *Attorney, Agent, or Firm*—Winston Hsu

(57) ABSTRACT

An injection-locked frequency divider includes a selecting module for generating a control signal; a biasing module coupled to the selecting module, for receiving an original signal and generating a biasing signal according to the control signal; and an oscillating module coupled to the biasing module, for receiving the biasing signal to generate a target signal. A ratio exists between the frequency of the target signal and the frequency of the original signal.

14 Claims, 3 Drawing Sheets

INJECTION-LOCKED FREQUENCY DIVIDER AND FREQUENCY DIVIDING METHOD THEREOF

BACKGROUND OF INVENTION

1. Field of the Invention

The present invention relates to an injection-locked frequency divider and the frequency dividing method thereof, and more particularly to an injection-locked frequency divider and a frequency dividing method for broadening the frequency bandwidth by controlling the biasing current.

2. Description of the Prior Art

Frequency divider plays a very important role in a frequency synthesizer and is used for performing frequency division to an original signal to generate a target signal. The ratio of the frequency of the target signal to the frequency of the original signal corresponds to a frequency dividing ratio of the frequency divider. As known by those skilled in the art, frequency divider is accomplished by cascading a plurality of frequency dividing units, such as flip-flops. The flip-flops are digital devices, and are driven by a default low voltage (such as 0V) and a default high voltage (such as 5V). Consequently, each flip-flop consumes a significant amount of power during charging and discharging. Hence, the traditional frequency divider consumes more power as the operating frequency is increased.

Therefore, an injection-locked frequency divider has been invented for solving the above-mentioned problem. As disclosed in "Superharmonic Injection-Locked Frequency Dividers", IEEE Journal of Solid-State Circuits, Vol. 34, No. 6, June 1999 by Rategh, whose contents are herein incorporated by reference, the injection-locked frequency divider is an analog device. It directly processes an originally inputted analog signal and outputs ananalog signal with divided frequency. Generally speaking, the injection-locked frequency divider is composed of an oscillating module and a biasing module. The biasing module is utilized to receive an original signal to be divided, wherein the original signal is transferred from a front-end circuit (such as the VCO of the frequency synthesizer), and then the biasing module transfers the original signal to the oscillating module. The well-designed injection-locked frequency divider can output a target signal with divided frequency from the oscillating module, where a ratio of the oscillating frequency of the target signal to the oscillating frequency of the original signal is locked at a specific value, which depends on the circuit characteristics.

Although the injection-locked frequency divider has the advantage of operating at a high frequency and can directly process an analog signal for reducing power consuming, the injection-locked frequency divider must be well-designed to match the oscillating frequency of the original signal and the oscillating frequency of the oscillating module (central frequency), so as to perform frequency division normally. Therefore, the frequency bandwidth of the injection-locked frequency divider is often very narrow.

SUMMARY OF INVENTION

One of the objectives of the claimed invention is to provide an injection-locked frequency divider and the method thereof, said frequency divider and the method being capable of broadening frequency by controlling biasing currents.

According to the claimed invention, an injection-locked frequency divider comprises a selecting module used for generating a control signal; a biasing module for receiving an original signal, and electrically connected to the selecting module for generating a bias signal according to the control signal; and an oscillating module electrically connected to the biasing module for receiving the bias signal to generate a target signal; wherein the frequency of the target signal and the frequency of the original signal are related by a ratio.

Also according to the claimed invention, a frequency dividing method comprises the following steps: inputting an original signal into a biasing module; inputting a control signal into the biasing module; utilizing the biasing module to generate a bias signal according to the original signal and the control signal; and utilizing an oscillating module to generate a target signal according to the biasing signal; wherein the frequency of the target signal and the frequency of the original signal are related by a ratio.

These and those objectives of the present invention will no doubt become obvious to those of ordinary skill in the art after reading the following detailed description of the preferred embodiment that is illustrated in the various figures and drawings.

DETAILED DESCRIPTION

Figure 1:
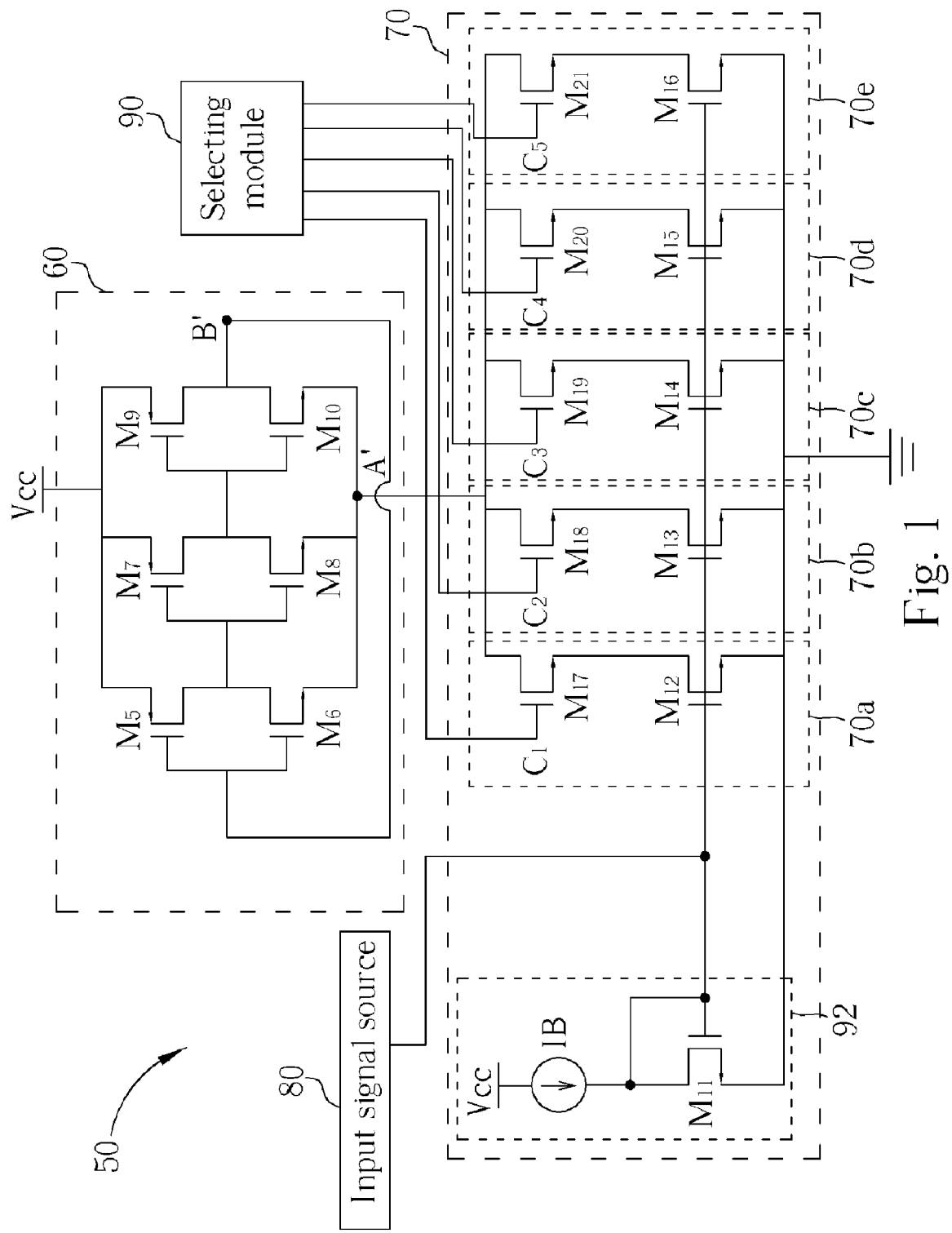
FIG. 1 is a diagram of an injection-locked frequency divider according to an embodiment of the present invention.

Please refer to FIG. 1, which is a diagram of an injection-locked frequency divider 50 (divide-by-3) according to an embodiment of the present invention. In this embodiment, the injection-locked frequency divider 50 comprises an oscillating module 60, a biasing module 70, and a selecting module 90. The biasing module 70 is utilized to receive an original signal transferred from an input signal source 80 (such as a VCO of a frequency synthesizer or any other signal source in need of frequency division) and is utilized to input current into the oscillating module 60 according to the original signal. So the oscillating module 60 can generate a target signal with divided frequency. Please note that the ratio of the oscillating frequency of the target signal to the frequency of the original signal is locked at a specific value, and such specific value depends on the circuit characteristics. In addition, the biasing module 70 also decides how much bias current is inputted into the oscillating module 60 according to the control signal transferred by the selecting module 90. As will be well understood by those skilled in the art, the oscillating frequency of the oscillating module 60 can be controlled by the inputted bias current and thus the operating frequency band of the injection-locked frequency divider 50 can be adjusted by the control mechanism mentioned above. Therefore, the injection-locked frequency divider 50 in this embodiment can operate within a broader operating frequency bandwidth.

In this embodiment, the oscillating module 60 is a ring oscillator that includes three inverters. The operating method and the configuration of the ring oscillator is well known by those skilled in the art and is therefore omitted here. The biasing module 70 comprises a plurality of sub-biasing modules 70a, 70b, 70c, 70d, and 70e that are respectively electrically connected through transistors M12, M13, M14, M15, and M16 to a bias current generator 92, wherein the bias current generator 92 comprises a current source IB and a transistor M11. This configuration provides a plurality of current mirrors so that each sub-biasing module can provide a bias current corresponding to the current mirror. In addition, each sub-biasing module 70a, 70b, 70c, 70d, and 70e comprises a controlling switch (such as M17, M18, M19, M20, and M21 shown in FIG. 1) that is turned on or turned off according to the control signals $C_1$, $C_2$, $C_3$, $C_4$, and $C_5$ generated by the selecting module 90, respectively. In other words, when a controlling switch is turned on, the corresponding sub-biasing module is enabled so that the selecting module 90 can control the bias current inputted into the oscillating module by way of generating one or different combinations of control signals $C_1$, $C_2$, $C_3$, $C_4$, and $C_5$. Consequently, the operating frequency band of the injection-locked frequency divider 50 can be further controlled by the inputted bias current. That is to say, the selecting module 90 can select one of the control signals $C_1$, $C_2$, $C_3$, $C_4$, and $C_5$ or the combination thereof to change the oscillating frequency of the target signal and further change the operating frequency band of the injection-locked frequency divider 50.

In this embodiment, because the oscillating module 60 is a ring oscillator including three inverters, the ratio of the oscillating frequency of the original signal to the oscillating frequency of the target signal is 3:1. This also means that the ratio of the oscillating frequency on node A to the oscillating frequency on node B is 3:1, as shown in FIG. 1. As described earlier, since the oscillating frequency of the oscillating module 60 is controlled by the inputted bias current, the central frequency of the oscillating module 60 changes with the bias current provided by the selecting module 90, so that the injection-locked frequency divider 50 can perform frequency division to different original signals with different oscillating frequencies. In other words, the injection-locked frequency divider 50 in this embodiment can operate within a broader frequency bandwidth through the operation of the plurality of sub-biasing modules 70a, 70b, 70c, 70d, and 70e.

The transistors M12, M13, M14, M15, and M16 for providing current mirrors inside the sub-biasing modules 70a, 70b, 70c, 70d, and 70e can have the same device characteristics, such as the W/L ratio (i.e., the aspect ratio). Therefore, the selecting module 90 can control the number of turnedon sub-biasing modules 70a, 70b, 70c, 70d, and 70e for controlling the bias current. However, the transistors M12, M13, M14, M15, and M16 for providing current mirrors inside the sub-biasing modules 70a, 70b, 70c, 70d, and 70e can have different device characteristics, such as different W/L ratios. For example, the W/L ratios of transistors M12, M13, M14, M15, and M16 can correspond to the following ratios: 1:1, 2:1, 4:1, 8:1, and 16:1 so that a much broader frequency bandwidth is accomplished by different control signals. Please note that although five sub-biasing modules 70a, 70b, 70c, 70d, and 70e are shown for illustration, this is not meant to be a limitation. The injection-locked frequency divider in this embodiment is not limited by the number of sub-biasing modules.

Figure 2:
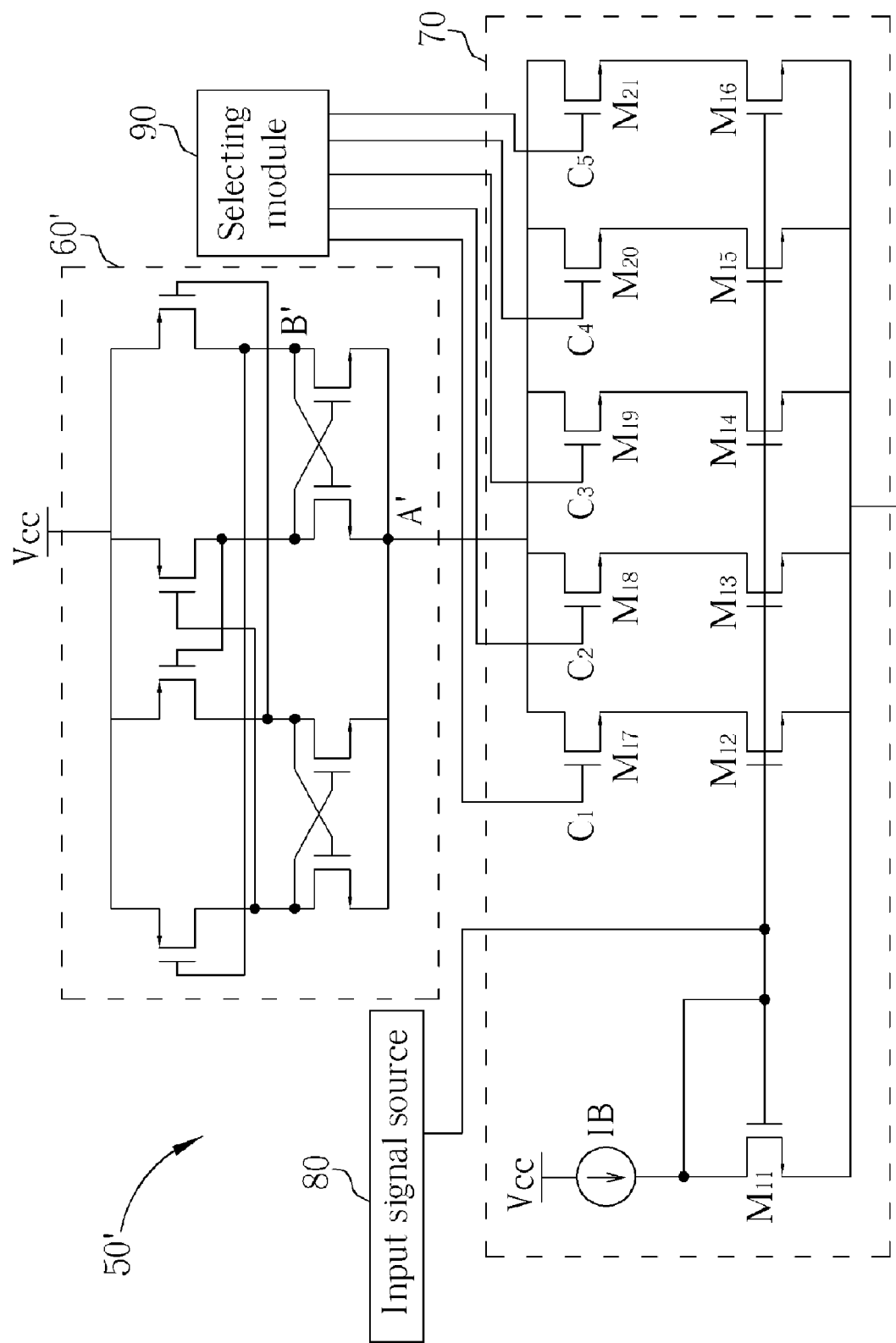
FIG. 2 is a diagram of an injection-locked frequency divider according to another embodiment of the present invention.

Please refer to FIG. 2, which is a diagram of an injection-locked frequency divider 50' (divide by 4) according to another embodiment of the present invention. The injection-locked frequency divider 50' in FIG. 2 is similar to the injection-locked frequency divider 50 in FIG. 1. The difference lies in that the ring oscillator 60 shown in FIG. 1 is substituted by a differential mode ring oscillator 60' shown in FIG. 2. The configuration and the operating principle of the differential mode ring oscillator are also known by those skilled in the art and detailed descriptions are thus omitted herein. Furthermore, the operating method of the injection-locked frequency divider 50' in FIG. 2 is otherwise the same as the operating method of the injection-locked frequency divider 50 in FIG. 1 and is also omitted herein.

Figure 3:
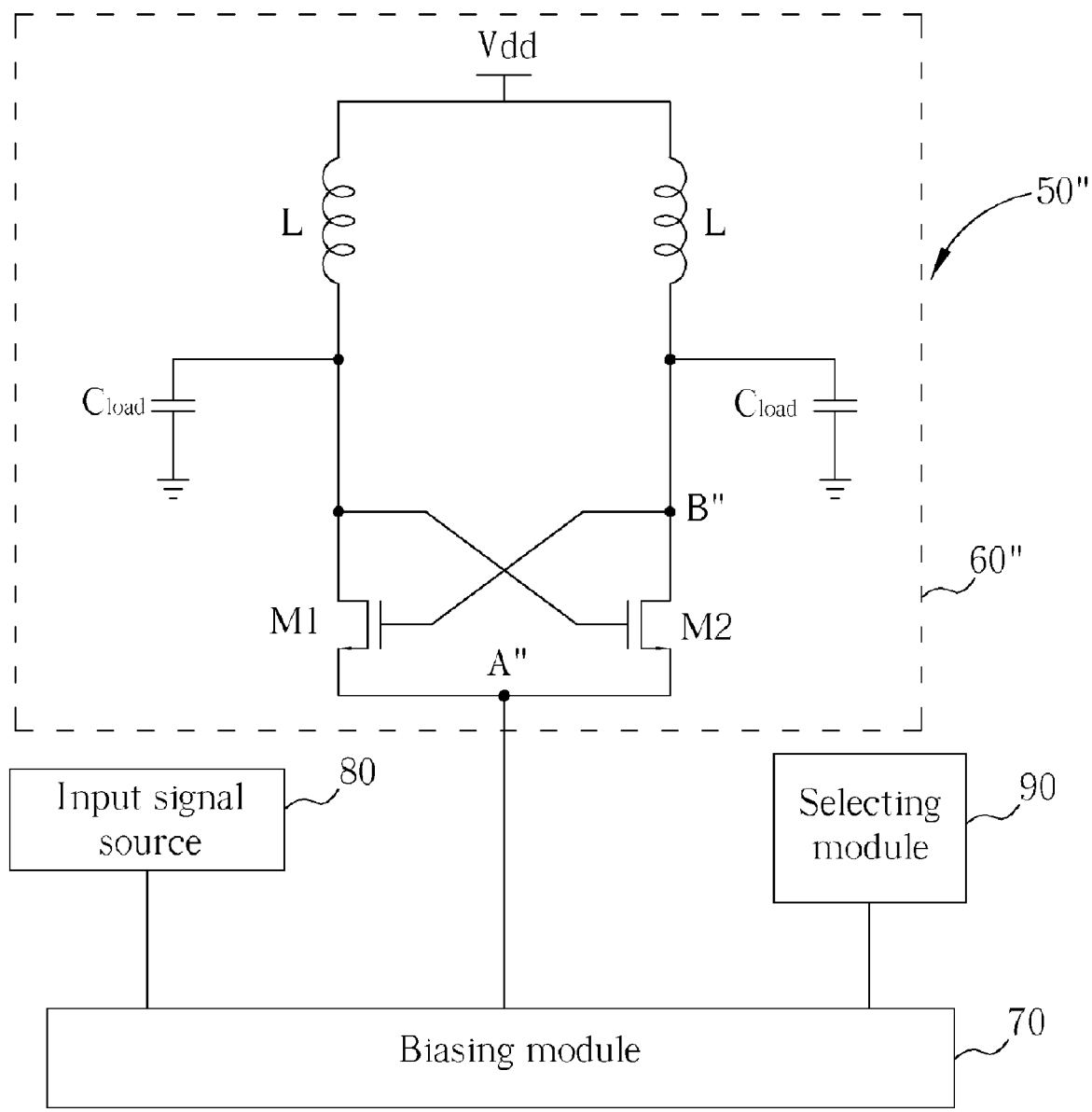
FIG. 3 is a diagram of an injection-locked frequency divider according to another embodiment of the present invention.

Please refer to FIG. 3, which is a diagram of an injection-locked frequency divider 50" (divide by 2) according to another embodiment of the present invention. The injection-locked frequency divider 50" in FIG. 3 and the injection-locked frequency divider 50 in FIG. 1 are similar. The difference lies in that the oscillating module 60 is substituted by a LC tank oscillator 60". The configuration and the operating method of the LC tank oscillator are also known by those skilled in the art and detailed descriptions are thus omitted herein. Again, the operating method of the injection-locked frequency divider 50" in FIG. 3 is otherwise the same as the operating method of the injection-locked frequency divider 50 in FIG. 1 and is also omitted herein.

Those skilled in the art will readily observe that numerous modifications and alterations of the device may be made while retaining the teachings of the invention. Accordingly, the above disclosure should be construed as limited only by the metes and bounds of the append claims.

What is claimed is:

1. An injection-locked frequency divider comprising:
   a selecting module used for generating a control signal;
   a biasing module electrically coupled to the selecting module for receiving an original signal and generating a bias signal according to the control signal; and
   an oscillating module electrically coupled to the biasing module for receiving the bias signal to generate a target signal; wherein the frequency of the target signal and the frequency of the original signal are related by a ratio.

2. The injection-locked frequency divider of claim 1, wherein the biasing module provides a biasing current of the bias signal to the oscillating module according to the control signal.

3. The injection-locked frequency divider of claim 1, wherein the selecting module changes the control signal for adjusting the bias signal, so as to modulate the operating frequency band of the injection-locked frequency divider.

4. The injection-locked frequency divider of claim 1, wherein the biasing module further comprises a plurality of sub-biasing modules.

5. The injection-locked frequency divider of claim 4, wherein each sub-biasing module comprises:
   a current source used for providing a current signal; and
   a switch being electrically coupled to the current source for executing an on/off operation according to the control signal.

6. The injection-locked frequency divider of claim 1, wherein the oscillating module is a ring oscillator.

7. The injection-locked frequency divider of claim 1, wherein the oscillating module is a differential mode ring oscillator.

8. The injection-locked frequency divider of claim 1, wherein the oscillating module is an LC tank oscillator.

9. A frequency dividing method comprising;
   inputting an original signal;
   inputting a control signal;
   utilizing a biasing module to generate a bias signal according to the original signal and the control signal; and utilizing an oscillating module to generate a target signal according to the biasing signal;

wherein the frequency of the target signal and the frequency of the original signal are related by a ratio;

wherein the step of generating the bias signal further comprises:

controlling enabling states of a plurality of sub-biasing modules according to the control signal.

10. The frequency dividing method of claim 9, wherein the step of generating the bias signal comprises:

controlling the biasing current of the bias signal according to the control signal.

11. The frequency dividing method of claim 9, further comprising:

changing the control signal to adjust the frequency of the target signal.

12. The frequency dividing method of claim 9, wherein the oscillating module is a ring oscillator.

13. The frequency dividing method of claim 9, wherein the oscillating module is a differential mode ring oscillator.

14. The frequency dividing method of claim 9, wherein the oscillating module an LC tank oscillator.

\* \* \* \* \*